United States Patent
Matsumoto

(10) Patent No.: US 6,412,087 B1
(45) Date of Patent: Jun. 25, 2002

(54) PATTERN DATA TRANSFER CIRCUIT

(75) Inventor: Toshihiko Matsumoto, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/362,975

(22) Filed: Jul. 28, 1999

(30) Foreign Application Priority Data

Jul. 30, 1998 (JP) .......................................... 10-216292

(51) Int. Cl.⁷ .............................................. G01R 31/28
(52) U.S. Cl. ...................................... 714/738; 714/743
(58) Field of Search ......................... 714/724, 32, 738, 714/743, 728, 739, 741; 712/20

(56) References Cited

U.S. PATENT DOCUMENTS

| | | | |
|---|---|---|---|
| 5,072,178 A | * 12/1991 | Matsumoto | 714/724 |
| 5,499,248 A | * 3/1996 | Behrens et al. | 714/724 |
| 5,535,410 A | * 7/1996 | Watanabe et al. | 712/20 |
| 5,737,512 A | * 4/1998 | Proudfoot ert al | 714/32 |
| 5,796,753 A | * 8/1998 | Kato | 714/738 |
| 5,883,906 A | * 3/1999 | Turnquist et al. | 714/738 |

* cited by examiner

*Primary Examiner*—David Ton
(74) *Attorney, Agent, or Firm*—Flynn, Theil, Boutell & Tanis, P.C.

(57) ABSTRACT

A pattern data transfer circuit capable of decreasing the number of transfer of pattern data and of shortening the entire transfer time as a whole. A chip selector circuit generates pin group data representing tester channels contained in respective pin groups on the basis of pin groups such as "ADDRESS" and adapter board data corresponding to the tester channels, and it validates only a chip select signal corresponding to the tester channel shown by the pin group data in the case of transfer of "I/O" data and "Strobe Mask" data, and also validated either chip selector signal CS corresponding to the tester channel in the case of transfer of "HiLo" data. A CPU extracts respective patterns of the selected pin group from pattern data and transfers the extracted patterns to all the pattern memories. As a result, "HiLo" data is sequentially transferred to the pattern memories for every tester channel, and data other than "HiLo" data are parallelly transferred to all tester channels shown by pin the group data.

2 Claims, 6 Drawing Sheets

| PIN GROUP | PIN NAME | TESTER CHANNEL |
|---|---|---|
| ADDRESS | A0 | 1 |
|  | A1 | 4 |
|  | A2 | 10 |
|  | A3 | 15 |
|  | A4 | 31 |
|  | A5 | 40 |
|  | A6 | 60 |
|  | A7 | 61 |
| DATA | D0 | 80 |

FIG. 5(PRIOR ART)

| PIN NAME | PATTERN DATA | (HiLo) | (I/O) | (STROBE MASK) |
|---|---|---|---|---|
| A0 | 0,1,L,1,1,H,..... | 0,1,0,1,1,1,..... | 1,1,0,1,1,0,..... | 1,1,0,1,1,0,..... |
| A1 | 1,0,H,0,0,L,..... | 1,0,1,0,0,0,..... | 1,1,0,1,1,0,..... | 1,1,0,1,1,0,..... |
| A2 | 1,1,H,1,1,H,..... | 1,1,1,1,1,1,..... | 1,1,0,1,1,0,..... | 1,1,0,1,1,0,..... |
| A3 | 0,0,L,0,0,L,..... | 0,0,0,0,0,0,..... | 1,1,0,1,1,0,..... | 1,1,0,1,1,0,..... |
| A4 | 1,0,H,1,1,L,..... | 1,0,1,1,1,0,..... | 1,1,0,1,1,0,..... | 1,1,0,1,1,0,..... |
| A5 | 0,1,L,0,0,H,..... | 0,1,0,0,0,1,..... | 1,1,0,1,1,0,..... | 1,1,0,1,1,0,..... |
| A6 | 0,1,H,1,1,L,..... | 0,1,1,1,1,0,..... | 1,1,0,1,1,0,..... | 1,1,0,1,1,0,..... |
| A7 | 1,0,L,0,0,H,..... | 1,0,0,0,0,1,..... | 1,1,0,1,1,0,..... | 1,1,0,1,1,0,..... |
| D0 | L,L,0,1,H,1,..... | 0,0,0,1,1,1,..... | 0,0,1,1,0,1,..... | 0,0,1,1,0,1,..... |

FIG. 6(PRIOR ART)

PATTERN DATA TRANSFER CIRCUIT

BACKGROUND OF THE INVENTION

1. Field of the Invention

The invention relates to a tester such as an IC tester for testing an IC Integrated Circuit), more particularly to a pattern data transfer circuit installed inside the tester for transferring pattern data.

2. Prior Art

Integrated circuits have been recently rapidly employed in various electric equipment. Products such as an IC, an LSI (large Integrated Circuit) are realized by circuits having functions of various elements such as a resistor, a capacitor, a transistor which are formed by printing, evaporating process, and the like. However, there occur slight variations in characteristics among various mass-produced devices. Under the circumstances, a test is performed whether characteristics of an IC, an LSI is up to a given standard or not using an IC tester.

Hereupon, a conventional pattern data transfer circuit used inside an IC tester is now described hereinafter.

FIG. 4 is a block diagram showing a conventional pattern data transfer circuit and an associated circuit connected to this pattern data transfer circuit 1. As shown in FIG. 4, the pattern data transfer circuit 1 comprises a CPU (Central Processing Unit) 2, a plurality of pattern memories 3 and a plurality of pattern generating circuits 4. The pattern data transfer circuit 1 is connected to a plurality of waveform shaping circuits 5 and a plurality of pin electronics 6 for testing the operation of a DUT (Device Under Test) 7. The pattern data transfer circuit 1 is also connected to a memory 8 and a RAM (Random Access Memory) 9, described later.

The pattern memories 3, the pattern generating circuits 4, the waveform shaping circuits 5 and the pin electronics 6 are respectively provided by the number corresponding to the number of tester channels of the IC tester built in the pattern data transfer circuit 1.

The detail of each component is now described. The DUT 7 is formed of an IC, an LSI, etc. and it is the object to be measured when the IC tester checks the operation of the DUT 7. Respective input/output pins of the DUT 7 are connected to the pin electronics 6 which are provided every tester channels. The memory 8 stores in advance therein various device programs corresponding to the variety of DUTs 7. The CPU 2 reads out device programs corresponding to the specified DUT 7 from the memory 8 and stores it in the RAM 9, thereby controlling hardware components inside the IC tester in accordance with the device programs. The CPU 2 temporarily stores adapter board data, pattern data respectively read out from the memory 8 in CPU memories 2a, 2b built therein. The function of the CPU 2 except that set forth above is described later.

Next, the adapter board and the pattern data are described These data are used by the device programs. FIG. 5 shows an example of the adapter board data. The adapter board data are used for specifying tester channels connected to respective input/output pins of the DUT 7 and comprise a plurality of groups composed of respective data of [Pin Group], [Pin Name], and [Tester Channel]. The [Pin Group] is used for dividing the input/output pins of the DUT 7 into those for every attribute and composed of those of "DATA", "ADDRESS", "MODE", "CLOCK" and so forth Exemplified in FIG. 5 is only the pin group of address ("ADDRESS" in the same figure) and data ("DATA" in the same figure). The [Pin Name] is an inherent name given to distinguish the respective input/output pins of the DUT 7 from one another. The [Tester Channel] is data which are assigned to the pin electronics 6 connected to the respective input/output pins of the DUT 7 for distinguishing the tester channels.

The first adapter board data shown in FIG. 5 relates to a pin having "ADDRESS" included in [Pin Group] and "A0" given to [Pin Name] which corresponds to tester channel "1" as [Tester Channel]. Likewise, any pin having "A1" to "A7" as [Pin Name] has "ADDRESS" included in [Pin Group] and each pin corresponds to tester channels "4", "10", "15", "31", "40", "60", and "61" as the [Tester Channel]. A pin having "DATA" belonging to [Pin Group] and "D0" given to [Pin Name] corresponds to a tester channel "80" as [Tester Channel]. The data following the above data are not illustrated, but they likewise correspond to tester channels as set forth above.

FIG. 6 shows an example of pattern data corresponding to the adapter board data shown in FIG. 5. Each pattern data is represented by 3-bit data of "HiLO", "I/O", and "Strobe Mask". Respective pattern data are used for controlling output levels of a driver waveform to be inputted to the pins of the DUT 7 ("HiLo" in the same figure) by way of tester channels corresponding to the respective [Pin Name], presence or absence of the receiving of the waveform outputted from the DUT 7 ("I/O" in the same figure), and presence or absence of decision of High/Low ("Strobe Mask" in the same figure) relative to the received waveform. Values of respective data contained in the pattern data mean as follows.

| "HiLo" | "1" → "High", | "0" → Low |
|---|---|---|
| "I/O" | "1" → Input, | "0" → Output |
| "Strobe Mask" | "1" → Absence of Decision, | |
| | "0" → Presence of Decision | |

For example, pattern data such as "0 output", "1 output", "L expectation", "1 output", "1 output", and "H expectation", . . . , . . . , are given to [Tester Channel] "1" corresponding to [Pin Name] "A0".

As evident from FIG. 6, for the "I/O" data and "Strobe Mask" data of the tester channel belonging to the Pin Group "ADDRESS", the same data are to be used for all the tester channels in the direction of a time axis. The pin group having the pattern common to all tester channels in respective pin groups is sometimes called hereinafter "common pin group".

Pattern data for every tester channels shown in FIG. 6 are stored in the pattern memories 3 shown in FIG. 4. The pattern generating circuits 4 generate pattern data (see "PATTERN DATA" shown in FIG. 6) on the basis of data stored in the pattern memories 3 corresponding to the their own tester channels and output the pattern data to the waveform shaping circuits 5 corresponding to the tester channels. The waveform shaping circuits 5 shape the driver waveform necessary for testing the DUT 7 in response to pattern data outputted from the pattern generating circuits 4 and output the shaped driver waveforms to the pin electronics 6 corresponding to the tester channels.

The pin electronics 6 are circuits at the side of the ICs used as interfaces between respective input/output pins of the DUT 7 and connected to the respective input/output pins of the DUT 7. The pin electronics 6 output the driver waveforms outputted from the waveform shaping circuits 5 to the respective input pins of the DUT 7 and receive waveforms outputted from the respective output pins of the DUT 7.

Described next along a flow chart in FIG. 7 is pattern data transfer operation by the pattern data transfer circuit 1. Described hereinafter is a case of transfer of pattern data (FIG. 6) corresponding to respective pins having "A0" to "A7" as [Pin Name] among the adapter board data (FIG. 5).

First, the CPU 2 reads out a device program corresponding to the DUT 7 from the memory 8 and transfers it to the RAM 9, and it transfers the adapter board data and pattern data used by the device program to the CPU memories 2a, 2b in which these data are temporarily stored.

Next, the CPU 2 recognizes [Tester Channel] corresponding to "A0" of [Pin Name] as "1" referring to the adapter board data in the CPU memory 2a of the CPU 2, and selects the tester channel "1" (Step 11). Then, the CPU 2 extracts "HiLo" data corresponding to [Pin Name] "A0" referring to pattern data in the CPU memory 2b of the CPU 2 (Step 12), and transfers the extracted "HiLo" data to the pattern memory 3 corresponding to the tester channel "1" (step S13). Subsequently similarly, the CPU 2 extracts "I/O" data corresponding to the tester channel "1" from the pattern data (step S14), and it transfers the extracted "I/O" data to the pattern memory 3 corresponding to the tester channel "1" (step S15), thereafter it extracts "Strobe Mask" data corresponding to the tester channel "1" from the pattern data (step S16), and transfers the extracted "Strobe Mask" data to the pattern memory 3 corresponding to the tester channel "1".

Subsequently, the CPU 2 decides whether there is any input/output pin to which data is not transferred (step S18). Since there remains a processing relating the input/output pins for [Pin Name] "A1" to "A7" (result of decision is "Y"), the CPU 2 returns its processing to step S11 where a transfer operation of the pattern data is executed like the case of [Pin Name] "A0". Consequently, a series of specified pattern data transfer operation is completed if the pattern data transfer processing relating to the [Pin Name] "A7" is completed (result of decision is "N").

As mentioned above, in the conventional pattern data transfer circuit 1, reading operation of "HiLo" data, "I/O" data, "Strobe Mask" data and transfer operation of these data to the pattern memories 3 are respectively sequentially performed for every selected tester channels. Accordingly, there arises the drawback that the number of data transfer becomes large, which results in the long transfer time as a whole.

SUMMARY OF THE INVENTION

The invention has been made in view of the problems of the conventional pattern data transfer circuit, and it is an object of the invention to provide a pattern data transfer circuit capable of parallelly executing the pattern transfer processings for every tester pattern channels as much as possible, so that the number of data transfer is reduced, thereby shortening the time for transferring data.

To achieve the above objects, the pattern data transfer circuit according to a first aspect of the invention comprises tester channels and pattern data for measurement assigned to respective pins of a device under test which are divided into pin groups for every attribute, common pin groups having a common pattern in which all pattern data of all pins in the common pin group are common pattern memories provided every tester channels to which respective pattern data corresponding to respective tester channels are transferred, the pattern data transfer circuit is characterized in further comprising pin group data generating means for generating pin group data representing all the tester channels assigned to respective pins in the common pin groups on the basis of the assignment of the respective tester channels relative to the pins, and transfer means for extracting the common patterns among the pattern data assigned to the common pin group, and parallelly and simultaneously transferring the extracted common patterns to all pattern memories corresponding to the respective tester channels represented by the pin group data.

In the pattern data transfer circuit according to a second aspect of the invention, the pattern memories are independently and selectively formed in response to a selection signal and the transfer means supplies the common patterns to all the pattern memories and also supplies the selection signals to the pattern memories corresponding to the tester channels represented by the pin group data.

BRIEF DESCRIPTION OF THE DRAWINGS

FIG. 5 is a view showing an example of the construction of an adapter board data;

FIG. 6 is a view showing an example of the construction of pattern data; and

PREFERRED EMBODIMENT OF THE INVENTION

A pattern data transfer circuit according to a preferred embodiment of the invention is now described thereunder.

Figure 1:
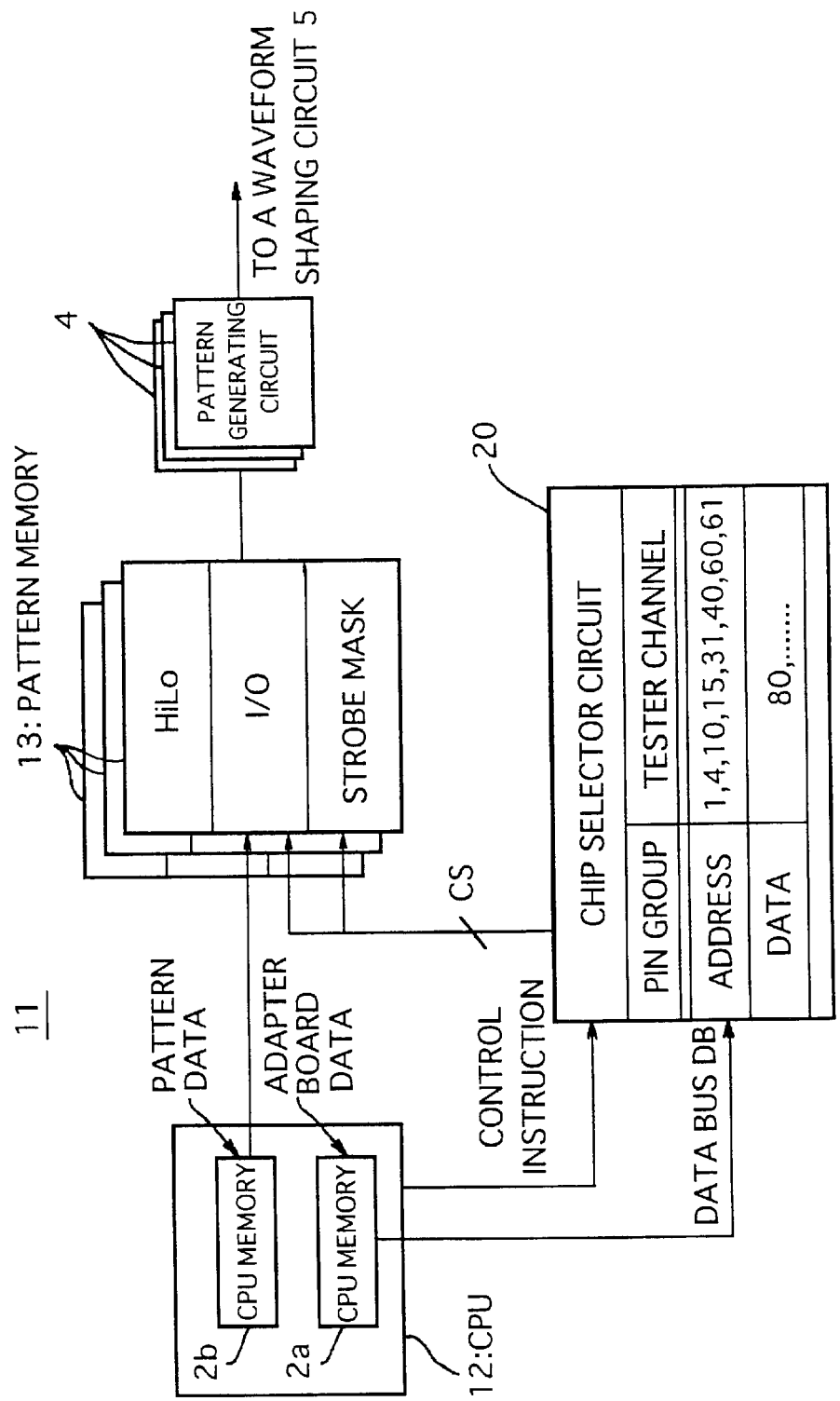
FIG. 1 is a block diagram showing the construction of a pattern data transfer circuit according to a preferred embodiment of the invention.
Figure 4:
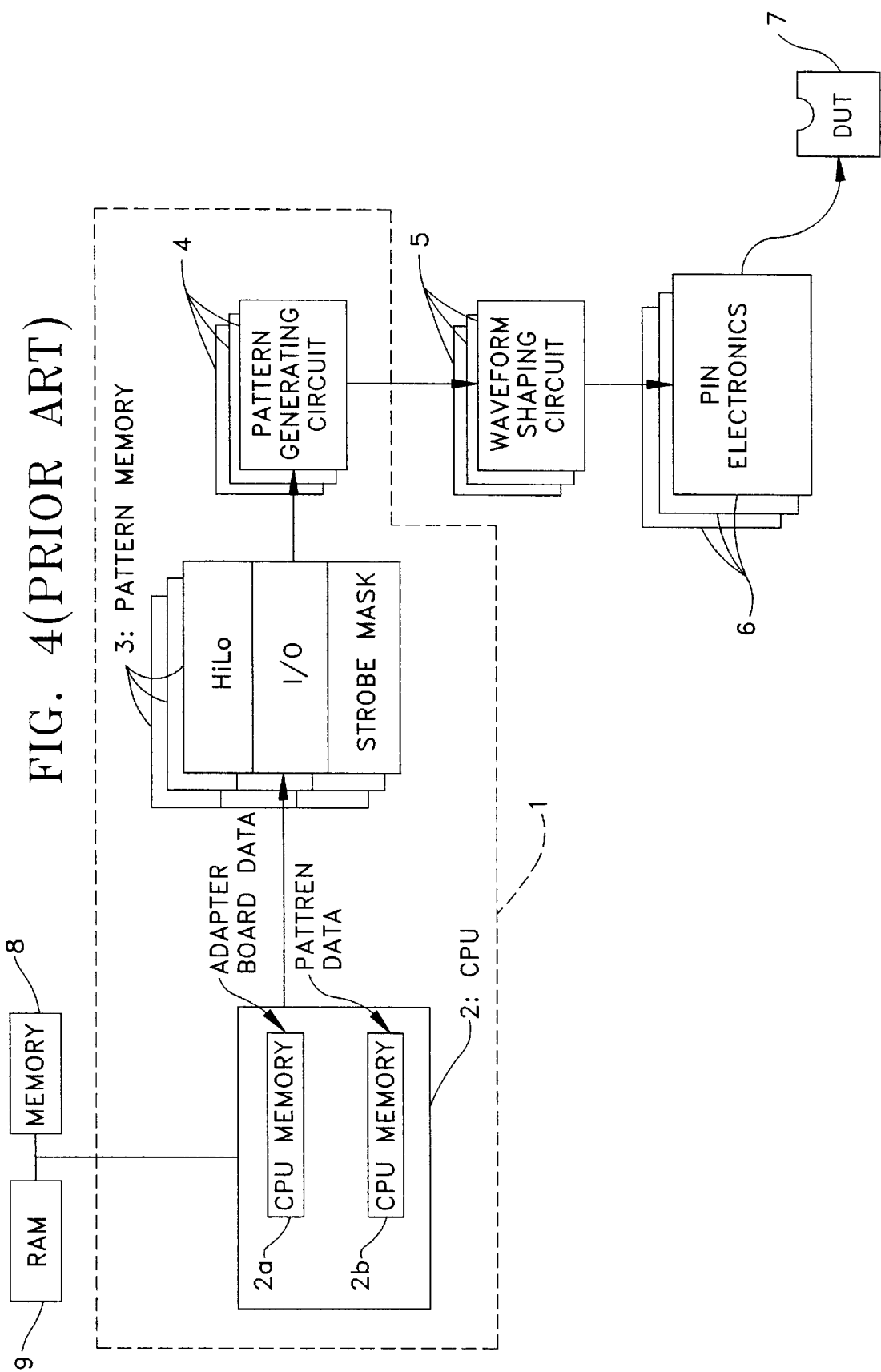
FIG. 4 is a block diagram showing a conventional pattern data transfer circuit and an associate circuit connected to this pattern data transfer circuit.
Figure 7:
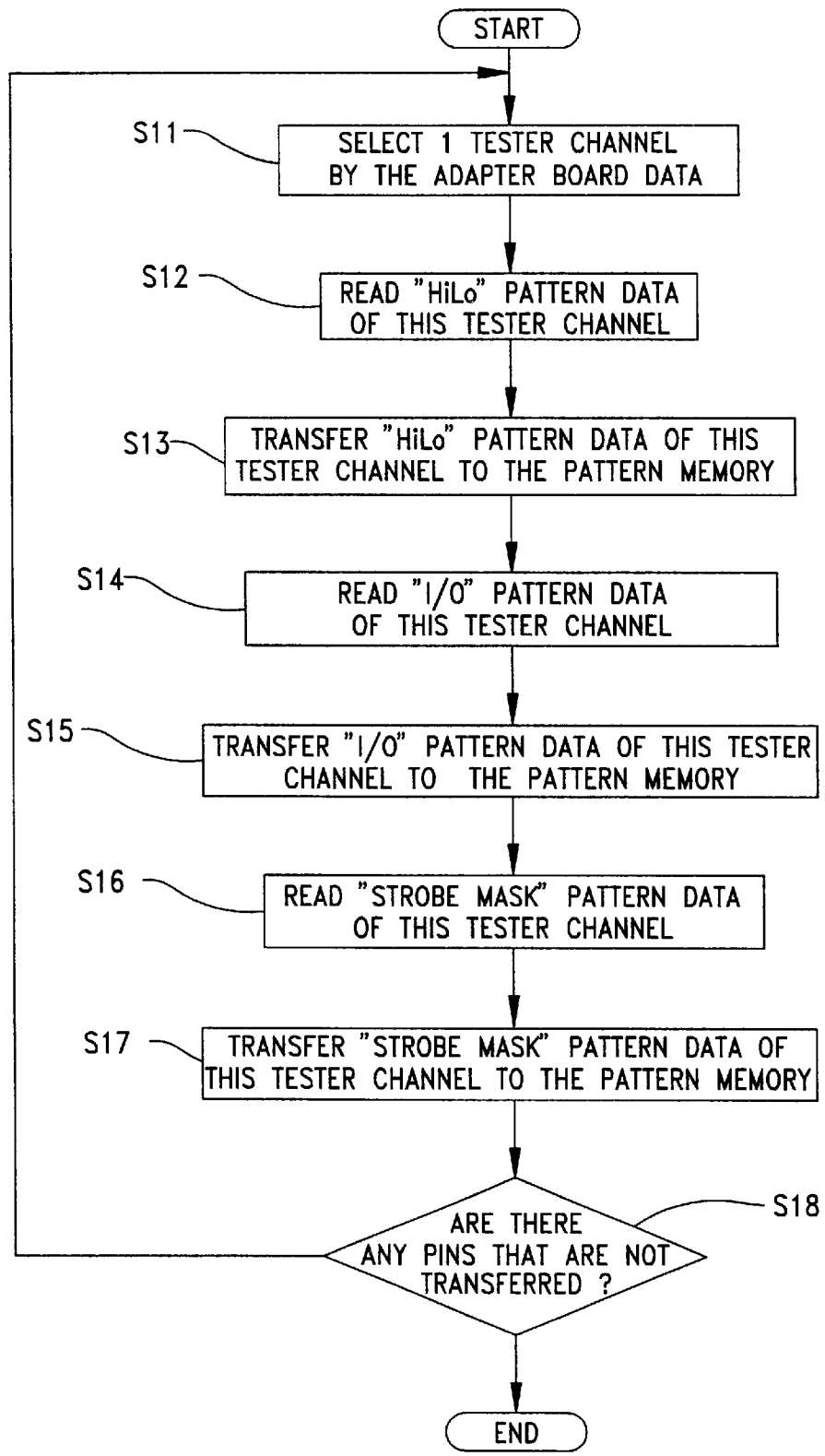
FIG. 7 is a flow chart showing procedures of a pattern data transfer operation performed by the conventional pattern data transfer circuit shown in FIG. 4.

FIG. 1 is a block diagram showing the construction of a pattern data transfer circuit according to the preferred embodiment of the invention. Components which are the same as those shown in FIG. 4 are depicted by the same reference numerals. In a pattern data transfer circuit 11 shown in FIG. 1, pattern generating circuits 4 are connected to a DUT 7 by way of waveform shaping circuits 5 and pin electronics 6 in the same manner as the conventional pattern data transfer circuit while a CPU 12 is connected to a memory 8 and a RAM 9 respectively shown in FIG. 4. The pattern data transfer operation is performed by the CPU 12 and a chip selector 20 among the circuits shown in FIG. 1.

The CPU 12 reads out a device program corresponding to the DUT 7 from the memory 8 and transfer the device program to the RAM 9 like the CPU 2 in FIG. 4, then it controls respective hardware components in the IC tester. The CPU 12 outputs adapter board data, which is stored temporarily in a CPU memory 2a, to the chip selector circuit 20, and it also outputs pattern data, which is stored temporarily in a CPU memory 2b, to the pattern memories 13 like the CPU 2 in FIG. 4. The function of the CPU 12 other than that set forth above is described more in detail later.

The pattern memories 13 have the same function as those of the pattern memories 3 shown in FIG. 4 and they are independently selected in response to a chip select signal CS supplied from the chip selector circuit 20, and all or a part of the pattern data supplied from the CPU 12 is written in the pattern memories 13.

The chip selector circuit 20 generates data showing tester channels such as "ADDRESS" or "DATA" or the like respectively contained in pin groups (hereinafter referred to as [pin group data]) on the basis of the adapter board data outputted from the CPU 12 for every pin groups. In FIG. 1, the pin group data stored in the chip selector circuit 20 is typically represented in correspondence with the adapter board data shown in FIG. 5. That is, the pin group data shown in FIG. 1 shows that there are tester channels "1", ..., "61" as the [Tester Channel] contained in the pin group "ADDRESS" while there are tester channels "80", ..., ..., as the [Tester Channel] contained in the pin group "DATA". Additionally, the chip selector circuit 20 controls the chip selector signal CS to be supplied to the pattern generating circuits 4 which is assigned to the respective tester channels contained in the selected pin group.

Figure 2:
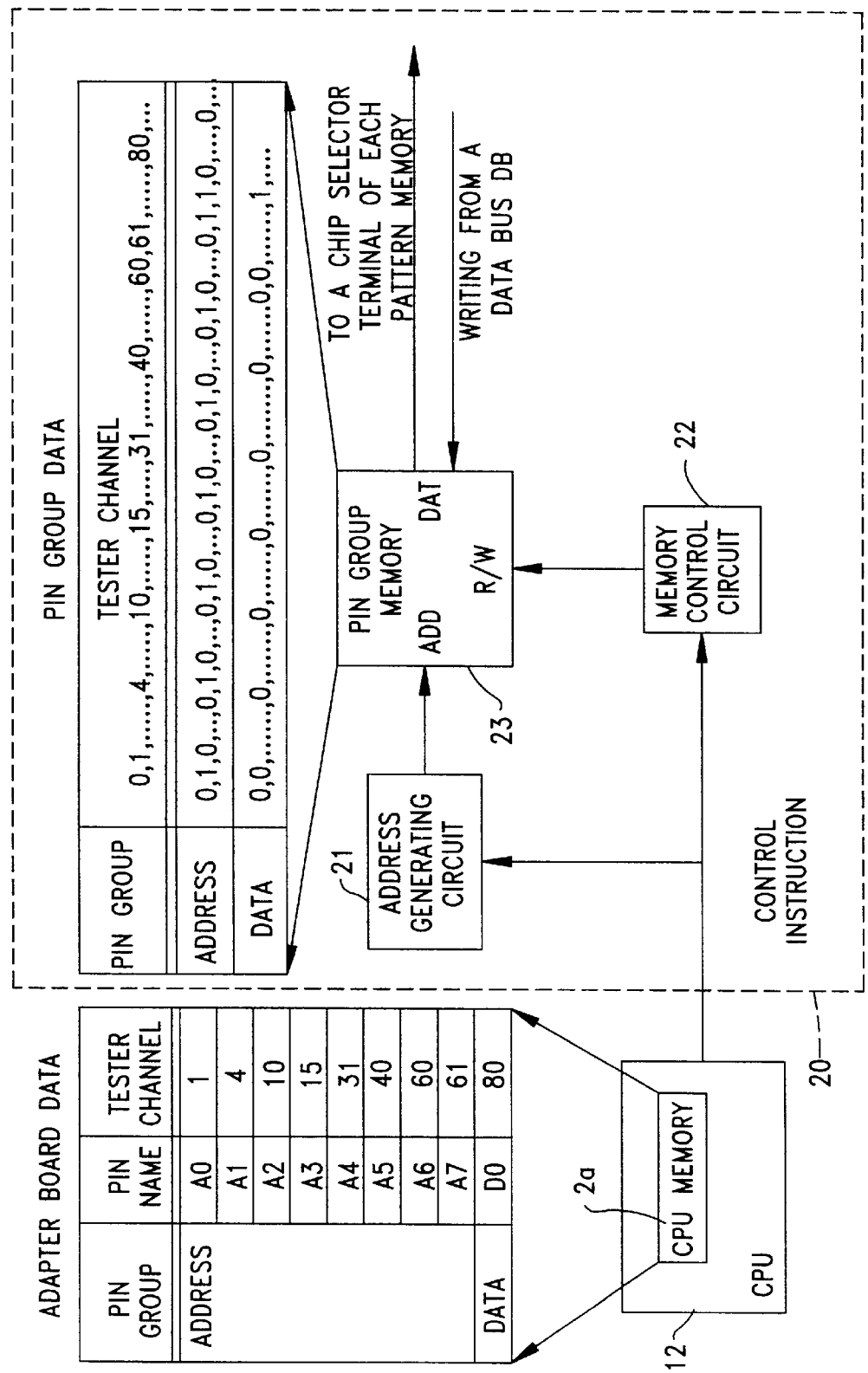
FIG. 2 is a block diagram showing the construction of a chip selector circuit of the pattern data transfer circuit in FIG. 1.

The detailed construction of the chip selector circuit 20 and the pin group data are described with reference to FIG. 2. As shown in FIG. 2, the chip selector circuit 20 comprises an address generating circuit 21, a memory control circuit 22, and a pin group memory 23. The CPU 12 controls the address generating circuit 21 in response to the adapter board data stored in the CPU memory 2a and also controls the memory control circuit 22 in accordance with the device program stored in the RAM 9 by supplying the control instruction to the address generating circuit 21 and the memory control circuit 22.

The address generating circuit 21 performs an address selection of the pin group memory 23 in accordance with the control instruction supplied from the CPU 12. That is, the address generating circuit 21 generates address in the pin group memory 23 corresponding to the respective [Pin Group] (such as "ADDRESS" and "DATA") in the adapter board data, and outputs the address value to an address terminal ADD of the pin group memory 23.

The memory control circuit 22 generates a read/write signal in response to the control instruction supplied from the CPU 12 and supplies it to a read/write terminal R/W of the pin group memory 23 and controls the read/write operation.

If the write signal is inputted to the read/write terminal R/W of the pin group memory 23, the pin group memory 23 converts the adapter board data supplied from the CPU 12 to a data terminal DAT through a data bus DB, into a pin group data format, and writes the converted pin group data in an address value or position inputted to the address terminal ADD. The pin group data format written in the pin group memory 23 is typically represented in FIG. 2. That is, the pin group data stores binary values representing whether the respective tester channels are included in [Pin Group] or not for all the tester channels (0, 1, ..., 80, ...). If the tester channel is contained in [Pin Group], "0" is stored.

Since "0" corresponds to [Tester Channel] "0" in the pin group "ADDRESS" in the example shown in FIG. 2, the [Tester Channel] "0" is not contained in this pin group, but "1" corresponds to [Tester Channel] "1", and hence it naturally means that the tester channel "1" is contained in the group. Likewise, it shows that "4", ..., "61" as the tester channels are contained in the pin group "ADDRESS". Further, the tester channels "80", ..., are contained in the pin group "DATA". The aforementioned example is applied to the other pin groups such as "MODE" and "CLOCK", etc.

On the other hand, the pin group memory 23 reads out the pin group data stored in the address having an address value inputted to the address terminal ADD from the data terminal ADD if the read signal is applied to the read write terminal R/W, and it outputs the read pin group data to the chip selector terminal of the respective pattern memories 13. Accordingly, if the address corresponding to the pin group "ADDRESS" is applied to the address terminal ADD, the pattern data is written in the pattern memory 13 corresponding to the tester channels "1", ..., "61" having the value "1" of the pin group data of the same pin group.

Figure 3:
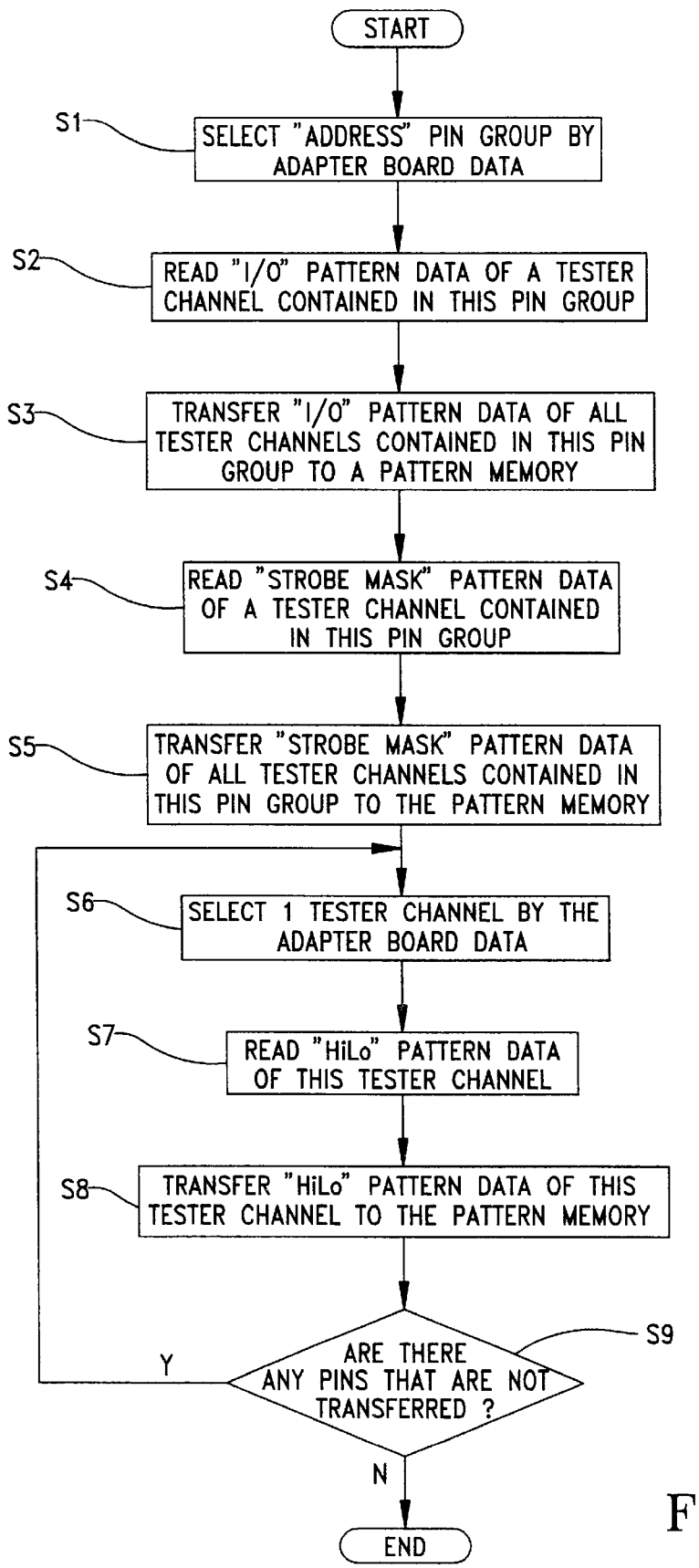
FIG. 3 is a flow chart showing procedures of a pattern data transfer operation performed by the pattern data transfer circuit in FIG. 1.

The pattern data transfer operation by the pattern data transfer circuit 11 is now described with reference to FIG. 3.

Described hereinafter with reference to FIG. 6 is a case of transfer of pattern data to respective pins having "A0" to "A7" as [Pin Name] among adapter board data (FIG. 5) similarly to the case of the conventional pattern data transfer described above.

First, the CPU 12 transfers a device program corresponding to the DUT 7 (FIG. 4) from the memory 8 to the RAM 9, then transfers adapter board data and the pattern data which are used by the device program to the CPU memories 2a, 2b, in which those data are temporarily stored.

Then, the CPU 12 supplies a control instruction to the address generating circuit 21 on the basis of the adapter board data which is stored in the CPU memory 2a, and allows the address generating circuit 21 to perform the operation set forth hereunder. That is, the address generating circuit 21 generates an address in the pin group memory 23 corresponding to the pin group "ADDRESS" and outputs an address value of this address to the address terminal ADD of the pin group memory 23. Further, the CPU 12 supplies the control instruction to the memory control circuit 22 in accordance with the device program stored in the RAM 9 and instructs the memory control circuit 22 to supply a write signal to the read write terminal R/W of the pin group memory 23. Still further, the CPU 12 supplies the adapter board data stored in the CPU memory 2a on the data bus DB. With the above operations, the pin group memory 23 converts the adapter board data supplied thereto into the pin group data, and writes the converted data in an address position corresponding to the pin group "ADDRESS".

Then, the CPU 12 instructs the address generating circuit 21 to continuously generate address values of addresses corresponding to the pin group "ADDRESS", and controls the memory control circuit AND gate 22 in the manner that the memory control circuit 22 outputs a read signal to the read write terminal R/W of the pin group memory 23. As a result, the pin group memory 23 reads out the pin group data relating to the pin group "ADDRESS" and outputs the read data to the data terminal DAT thereof. On the other hand, the CPU 12 selects the tester channels "1", ..., "61" contained in the pin group "ADDRESS" referring to the adapter board data stored in the CPU memory 2a (step S1).

Subsequently, the CPU 12 reads out "I/O" data relating to the tester channel "1" among the tester channels contained in the pin group "ADDRESS" (see FIG. 6) referring to the pattern data stored in the CPU memory 2b (step S2). Then, the CPU 12 parallelly outputs "I/O" data relative to all the pattern memories 13 in step S2 to I/O data storage areas of respective pattern memories. As a result, the "I/O" data is transferred to only the pattern memory 13 selected by the chip selector circuit 20 in response to the chip selector signal CS (step S3). Meanwhile, since the "I/O" data is common to all the tester channels, "I/O" data of the other channels except the tester channel "1" may be read out in step S2.

Likewise, the CPU 12 reads out "Strobe Mask" data relating to the tester channel "1" among the tester channels contained in the pin group "ADDRESS" referring to pattern data stored in the CPU memory 2b (step S4). Then, the CPU 12 parallelly outputs "Strobe Mask" data read out relative to all the pattern memories 13 in step S4 to "Strobe Mask" data storage areas in respective pattern memories. As a result, the "Strobe Mask" data is transferred to a pattern memory 13 selected by the chip selector circuit 20 in response to the chip selector signal CS (step S5). Since the "Strobe Mask" data is common to all the tester channels, like the "I/O" data, "Strobe Mask" data of other tester channels except the tester channel "1" may be read out in step S4.

The CPU 12 selects either tester channel among the tester channels contained in the pin group "ADDRESS" referring to the adapter board data stored in the CPU memory 2a (step S6). Hence, the CPU 12 first selects the tester channel "1" as the tester channel, then supplies a control instruction to the chip selector circuit 20 to validate only the chip selector signal CS of the pattern memory 13 corresponding to the tester channel "1". Next, the CPU 12 extracts "HiLo" data relating to the tester channel "1" from the pattern data stored in the CPU memory 2b (step S7). Then, the CPU 12 transfers "HiLo" data which is read out in step S6 to the pattern memory 13 corresponding to the tester channel "1" which is selected in response to the chip selector signal CS (step S8).

Then, the CPU 12 decides whether there is any input/output pin to which data is not transferred (step S9). Since these remain the processings relative to the tester channels "4" to "61" (result of decision is "Y"), the CPU 12 returns the processings to step S6 where it performs the transfer of "HiLO" data relative to the remaining tester channels like the tester channel "1". In such a manner, if the transfer of "HiLo" data relative to the tester channel "61" is completed (result of decision is "N" in step S9), a series of pattern data transfer operations relating to the selected pin group "ADDRESS" are completed.

As mentioned above, according to the invention, the processing for parallel and simultaneous transfer of "I/O" data and "Strobe Mask" data relative to all the tester channels contained in the selected pin group and the processing for individual and sequential transfer of "HiLo" data relative to the tester channels contained in the pin group are combined with each other. That is, according to the invention, it is not necessary to sequentially transfer all pattern data ("HiLo", "I/O" and "Strobe Mask") for every selected tester channels as made conventionally. As a result, according to the invention, such a problem of the conventional pattern data transfer circuit that the number of data transfer increases to increase the transfer time is solved, and hence the entire transfer time involved in the pattern data transfer can be reduced.

As explained above, according to the invention, the pin group data representing all the tester channels assigned to respective pins are generated for the common pin group in which pattern data of all the pins in the pin group have the same pattern on the basis of the assignment of the respective tester channels relative to the pins, and the common patterns among the pattern data which are assigned to the common pin group are extracted, then the extracted patterns are parallelly and simultaneously transferred to all the pattern memories corresponding to respective tester channels represented by the pin group data. With such a parallel transfer processing, it is possible to decrease the number of transfer of pattern data to shorten the entire transfer time of the pattern data.

What is claimed is:

1. A pattern data transfer circuit having tester channels and pattern data for measurement assigned to respective pins of a device under test, said tester channels being divided into pin groups for every attribute, common pin groups having a common pattern in which all the pattern data of all the pins in the pin group are common, pattern memories provided for each of the tester channels to which the respective pattern data corresponding to the respective tester channels is transferred, said pattern data transfer circuit further comprising:

pin group data generating means for generating pin group data representing all the tester channels assigned to the respective pins in the common pin groups on the basis of the assignment of the respective tester channels relative to the pins; and transfer means for extracting the common patterns among the pattern data assigned to the common pin group, and in parallel and simultaneously transferring the extracted common patterns to all the pattern memories corresponding to the respective tester channels represented by the pin group data.

2. The pattern data transfer circuit according to claim 1, wherein the pattern memories are independently and selectively formed in response to a selection signal and the transfer means supplies the common patterns to all the pattern memories and also supplies the selection signal to the pattern memories corresponding to the tester channels represented by the pin group data.

* * * * *